(12) United States Patent
Anderson et al.

(10) Patent No.: US 8,913,447 B2
(45) Date of Patent: Dec. 16, 2014

(54) METHOD AND APPARATUS FOR MEMORY COMMAND INPUT AND CONTROL

(75) Inventors: Jacob Robert Anderson, Meridian, ID (US); Kang-Yong Kim, Boise, ID (US); Tadashi Yamamoto, Ibaraki (JP); Zer Liang, Ibaraki Prefecture (JP); Huy Vo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 297 days.

(21) Appl. No.: 13/168,723

(22) Filed: Jun. 24, 2011

(65) Prior Publication Data
US 2012/0327728 A1 Dec. 27, 2012

(51) Int. Cl.
*G11C 7/00* (2006.01)
(52) U.S. Cl.
CPC ........................................ *G11C 7/00* (2013.01)
USPC ...................... 365/191; 365/195; 365/189.011
(58) Field of Classification Search
USPC ............. 365/189.011, 189.05, 191, 193, 195, 365/196
See application file for complete search history.

(56) References Cited

U.S. PATENT DOCUMENTS

| | | | |
|---|---|---|---|
| 4,942,519 A * | 7/1990 | Nakayama | 710/110 |
| 5,959,930 A * | 9/1999 | Sakurai | 365/230.03 |
| 6,646,953 B1 | 11/2003 | Stark | |
| 6,741,111 B1 | 5/2004 | Wu | |
| 7,068,562 B2 * | 6/2006 | Miura et al. | 365/230.03 |
| 7,295,489 B2 | 11/2007 | Yoon et al. | |
| 7,342,838 B1 | 3/2008 | Sharpe-Geisler et al. | |
| 7,466,577 B2 * | 12/2008 | Sekiguchi et al. | 365/51 |
| 7,472,304 B2 | 12/2008 | Malekkhosravi et al. | |
| 7,702,004 B2 | 4/2010 | Deas et al. | |
| 7,721,010 B2 | 5/2010 | Schnell et al. | |
| 7,746,711 B2 * | 6/2010 | Inaba | 365/193 |
| 7,965,531 B2 * | 6/2011 | Matsui et al. | 365/51 |
| 2002/0015342 A1 * | 2/2002 | Kuge | 365/201 |
| 2002/0120829 A1 * | 8/2002 | Murakami et al. | 712/207 |
| 2004/0046611 A1 * | 3/2004 | Uneme | 331/17 |
| 2008/0068900 A1 * | 3/2008 | Bhakta et al. | 365/189.08 |
| 2009/0049267 A1 * | 2/2009 | Perner et al. | 711/170 |
| 2009/0103372 A1 * | 4/2009 | Shau | 365/189.02 |

* cited by examiner

*Primary Examiner* — Son Dinh
*Assistant Examiner* — Uyen B Tran
(74) *Attorney, Agent, or Firm* — Dorsey & Whitney LLP

(57) ABSTRACT

Memories containing command decoder, chip enable, and signal truncation circuits are disclosed. One such command decoder circuit may include command decoder logic configured to receive command signals and output a decoded command to an interconnect bus responsive to a chip select signal having an active state. Decoder circuits may also prevent coupling commands to the interconnect bus based on the receipt of chip select signals having inactive states. The memory further may include chip enable circuits having control logic configured to receive chip select signals and provide the chip select signals to an interconnect bus responsive to receiving a valid command. Chip enable circuits may also prevent coupling chip select signals to the interconnect bus from chip enable signals based on the receipt of invalid command signals. Signal truncation circuits may be used to shorten and/or shift chip select signals to increase timing margins and improve the reliability of command execution by memories.

24 Claims, 6 Drawing Sheets

| | |
|---|---|
| RAS# | H |
| CAS# | H |
| WE# | H |
| CS0# | X |
| CS1# | X |
| CS2# | X |
| CS3# | X |

| | |
|---|---|
| RAS# | X |
| CAS# | X |
| WE# | X |
| CS0# | H |
| CS1# | H |
| CS2# | H |
| CS3# | H |

METHOD AND APPARATUS FOR MEMORY COMMAND INPUT AND CONTROL

TECHNICAL FIELD

This invention relates to memory systems, and more particularly, to memory systems using a master-slave configuration in memory.

BACKGROUND OF THE INVENTION

As memory devices of all types have evolved, continuous strides have been made in improving their performance in a variety of respects. For example, to further efforts of maximizing storage density, multiple memories have been placed together into a single package. Such implementations increase the storage space in memory while reducing the overall physical footprint. In some designs, only one memory of a package is linked to external devices through the packaging substrate. Thus capacitive loading of a multiple memory package is equivalent to that of a single memory package. Moreover, one memory is often connected to the package I/O (i.e. "master") and configured to interface with other memories (i.e. "slaves") via memory to memory interconnections. As a result, proper operation of the memory communication requires routing command signals to the correct memory within the package and relies on various internal clock and control signals as well as the timing of those signals relative to one another.

Because master memory control logic interfacing with external devices is normally synchronous, the execution of logic functions must occur within a certain amount of time, typically equal to the clock period. As the external clock and control signal frequencies are increased, inherent timing variations between internal signals of the system relative to one another become more significant. Thus, maintaining correct signal timing between various command signals has presented difficulties in high frequency systems. Signal propagation delays can fluctuate due to variations in logic gate delay and electrical characteristics of memory to memory interconnections, and if relative timing is not maintained, erroneous operation may occur, resulting, for example, in a memory registering improper command instructions. Additionally, signal skewing may become even further pronounced for systems consisting of multiple components that work in coordination for proper operation. Accordingly, there is therefore a need for memory logic that can reduce timing variation dependency in multiple device memories utilizing high clock frequencies.

DETAILED DESCRIPTION

Embodiments of the invention are directed toward a memory having a master-slave memory unit configuration that provides decoding logic for memory control bus implementations. Certain details are set forth below to provide a sufficient understanding of various embodiments of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
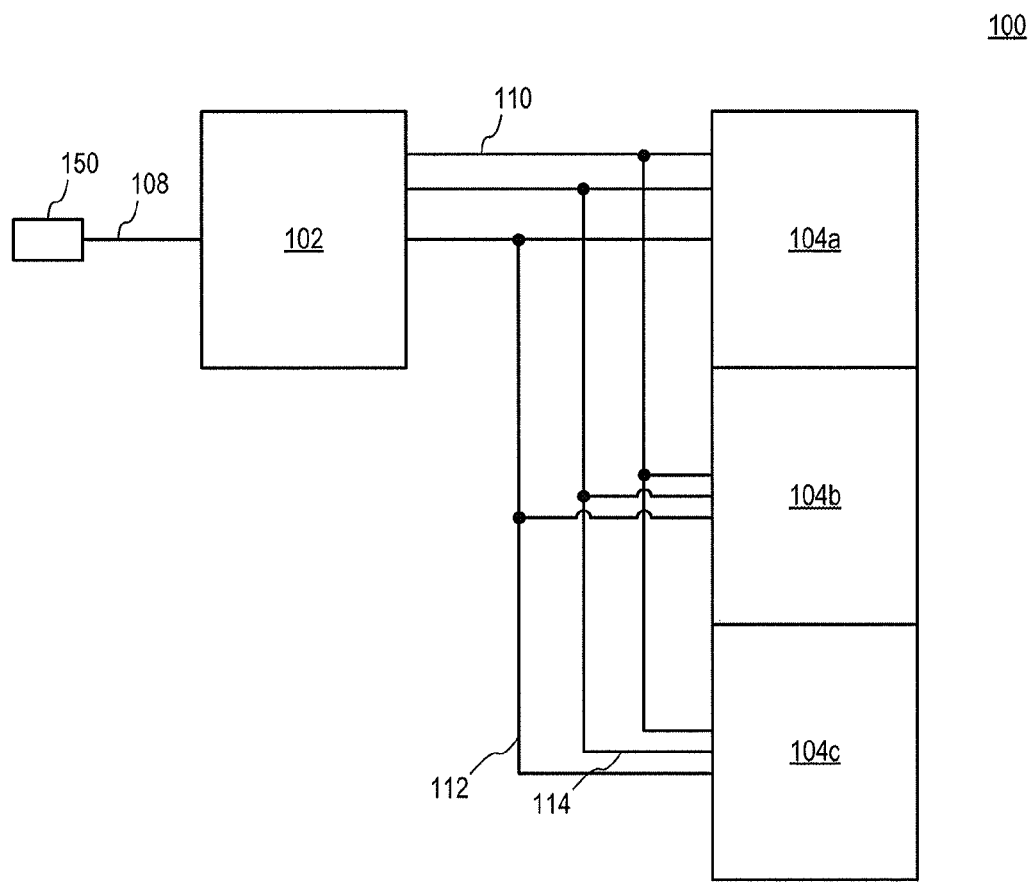
FIG. 1 is a block diagram of a memory according to an embodiment of the invention.

FIG. 1 illustrates a memory 100 according to an embodiment of the present invention. The memory 100 may include a master memory unit 102 and a plurality of slave memory units 104a-c. The master memory unit 102 and each of the plurality of slave memory units 104a-c may be identical and may be stacked on top of each other. Additionally, memory units included in the memory 100 may be on a common substrate or multi-chip module. Although the memory 100 includes four memory units, other embodiments may include a lesser or greater number of memory units. Memory units in memory unit 100 may include an array of memory cells and control logic for accessing data stored in the memory arrays.

An interconnect bus 110 included in memory 100 may allow master memory unit 102 to interface with the plurality of slave memory units 104a-c. Interconnect bus 110 may include a plurality of signal lines configured for enabling a particular memory unit during a memory command and/or transmitting commands to memory units to execute. Such commands may include, for example, read, write, precharge, and refresh operations. Master memory unit 102 may further be coupled to slave memory units 104a-c through a read bus 112 and a write bus 114 on which data may be exchanged. Interconnect bus 110, read bus 112, and write bus 114 may be implemented with interconnects, such as wires, conductive structures, or through silicon vias ("TSVs") used to interconnect stacked die.

Memory 100 also may include an I/O bus 108 through which sequential input/output ("I/O") signals associated with conventional memory commands, addresses, and write data are applied to master memory unit 102. Similarly, I/O signals corresponding to read data may be read out of master memory unit 102 through I/O bus 108. Each signal line associated with I/O bus 108 may be coupled to a corresponding contacts 150. Contacts 150 may act as an external nodes for memory 100 and allow data to be exchanged between memory 100 and an external device (not shown).

Master memory unit 102 may also include control logic for receiving signals over I/O bus 108. In at least one embodiment, for example, such signals may include a row address select signal RAS#, a column address select signal CAS#, a write enable signal WE#, a clock signal CLK, and a plurality of chip select signals (e.g. CS0#-CS3#). While command signals received by memory 100 may be active low signals, other embodiments may utilize other methods as will be appreciated by those skilled in the art.

Each of the chip select signals may correspond to the master memory unit 102 and the plurality of slave memory units 104a-c. For example, chip select signal CS0# may correspond to master memory unit 102, CS1# may correspond to slave memory unit 104a, etc. It will be appreciated by those skilled in the art that although the embodiment in FIG. 1 includes a total of three slave memory units 104, any number of slave memory units 104 and corresponding chip select signals may be implemented in memory 100.

In operation, a command is provided through contacts 150 to the master memory unit 102. Control logic inside of the master memory unit 102 decodes the command and determines if either the master memory unit 102 or any of the plurality of slave memory units 104a-c is intended to receive the decoded command. Specifically, chip select signals are processed to determine if any memory unit in memory 100 should be enabled based on an active state chip select signal corresponding to a specific memory unit. Master memory unit 102 may also decode other signals to determine the type of command received. RAS#, CAS#, and WE#, for example, may be decoded to determine the type of command to be executed on an enabled memory unit.

As will be explained in greater detail below, if a chip select signal has an active state and the decoded command is valid, the command may be coupled to the interconnect bus 110 and the memory unit corresponding to the active state chip select signal may be enabled to read the command from of the interconnect bus 110 and execute the command accordingly.

In some embodiments, interconnect bus 110 may have a width of 11 bits with seven bits corresponding to a command set and four bits corresponding to each memory unit in a four memory unit system. It will be appreciated by one skilled in the art that interconnect bus 110 may have any bit width and that other embodiments may implement any number of memory units.

Figure 2:
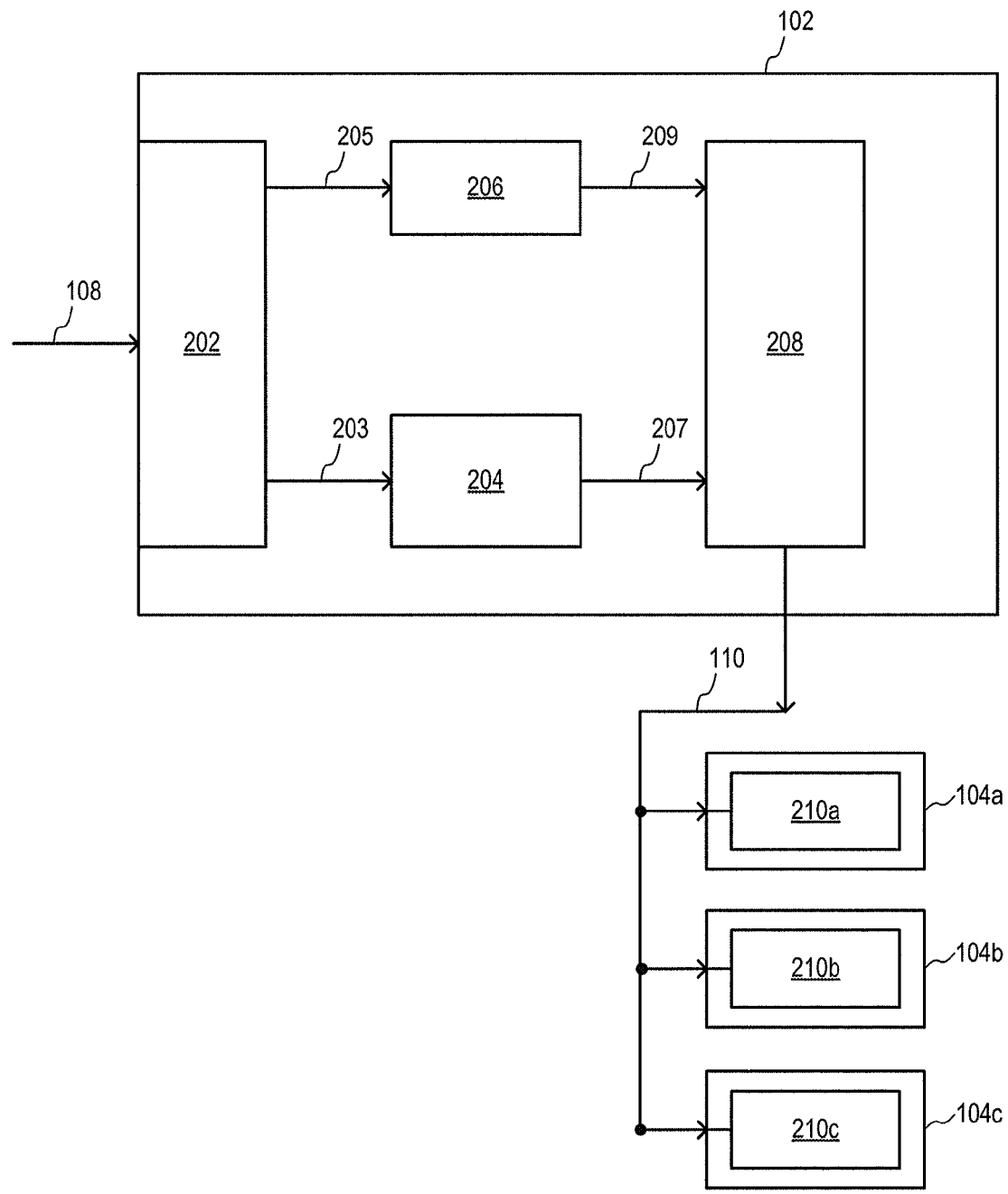
FIG. 2 is a block diagram of a portion of a memory unit included in the memory of FIG. 1 according to an embodiment of the invention.

A master memory unit 102 and a plurality of slave memory units 104a-c according to an example of the invention are shown in FIG. 2. The master memory unit 102 includes an input path circuit 202 configured to receive command signals over I/O bus 108 (FIG. 1). In an embodiment, input path 202 is configured to receive a row address select signal, a column address select signal, a write enable signal, and a plurality of chip select signals (FIG. 1) on the I/O bus 108. Input path circuit 202 may further include control logic to generate inverted signals corresponding to those received on I/O bus 108. The design and operation of such logic is well known by those ordinarily skilled in the art, and consequently, a more detailed description has been omitted from herein in the interest of brevity.

Input path circuit 202 may interface with a plurality of chip enable circuits 206 through chip enable busses 205. A corresponding chip enable circuit 206 may be included in master memory unit 102 for each chip select input included in I/O. bus 108. Chip enable busses 205 may be configured to couple row address select signals, column address select signals, and write enable signals to each chip enable circuit 206. Chip enable busses 205 may be further configured to couple each chip select signal from input path 202 to the corresponding chip enable circuit 206.

Input path 202 may further interface with command latch decoder 204 over local command bus 203. Command latch decoder 204 may contain control logic for decoding commands received by input path 202 and detecting if any chip select signals are in an active state. As will be explained further below, this ensures that commands reach interconnect bus 110 only when one of the memory units has an active corresponding chip select signal.

Both command latch decoder 204 and chip enable circuits 206 may further be coupled to a master interconnect 208 over a global command bus 207 and a latched chip select bus 209, respectively. This allows for both active chip select signals and decoded commands to be coupled to master interconnect 208. As will be explained below in greater detail, active chip select signals and valid decoded commands may be coupled to the interconnect bus 110 from master interconnect 208 and subsequently to a specific memory unit in memory 100.

Slave memory units 104a-c included in memory 100 (FIG. 1) are also illustrated in FIG. 2. Each slave memory unit 104 includes a slave interconnect 210 that is coupled to the interconnect bus 110. As interconnect bus 110 is further coupled to master interconnect 208, commands and active chip select signals may be coupled from the master memory unit 102 to the slave memory units 104a-c via interconnect bus 110.

In operation, command signals are coupled from the contacts 150 (FIG. 1) to the input path 202. The signals received by input path 202 are then coupled to both the command latch decoder 204 and the chip enable circuits 206. Command latch decoder 204 may receive command signals RAS#, CAS#, and WE# as well as the plurality of chip select signals. Each chip enable circuit 206 may receive RAS#, CAS#, and WE# command signals as well as a corresponding chip select signal.

Chip enable circuits 206 may compare received command signals to determine if a valid command has been received by master memory unit 102. In the event that a valid command has been received and a chip enable circuit 206 has received a chip select signal in an active state, the corresponding chip enable circuit 206 may couple the chip select signal onto a corresponding signal line of the interconnect bus 110, thereby enabling the memory unit corresponding to the active chip select signal. Some commands, however, may be valid but any active state chip select signals also received may not be provided to any of the memory units. For example, if a command is decoded as a NoOp (i.e., no operation), chip enable circuit 206 may not provide an active chip select signal on the corresponding signal lines on interconnect bus 110 even if a chip enable circuit 206 has received a chip select signal in an active state. In at least one embodiment, preventing active state chip select signals received by the chip enable circuits 206 from being coupled onto interconnect bus 110 may be done by utilizing a transistor, for example, such as in cases using a transistor as a switch. However, other methods that may be used will be apparent to those skilled in the art.

Command latch decoder 204 may decode a command received from input path 202 to generate a decoded command. Command latch decoder 204 may further be configured to receive the plurality of chip select signals and determine whether memory 100 is in a deselect condition, indicating that all chip select signals are inactive. If memory 100 is not in a deselect condition, the decoded command may be coupled to the interconnect bus 110 where an enabled memory unit may read and execute the decoded command. If the command latch decoder 204 detects a deselect condition, commands may be prevented from being coupled onto interconnect bus 110. In some embodiments, preventing the coupling of commands to interconnect bus 110 in this manner may be done using transistor logic. However, other methods that may be used will be apparent to those skilled in the art.

Command latch decoder 204 and/or the chip enable circuits 206 may also generate internal signals that are derived from the command signals each may receive. In at least one embodiment, received signals may be shifted and/or truncated and provided to interconnect bus 110. This may improve relative timing between signals provided to master memory unit 102 and slave memory units 104a-c. For example, by providing a greater timing margin for the chip select signals relative to the command signals, more robust operation may be provided. In a number of embodiments, functionality of chip enable circuits 206 and command latch decoder 204 may be combined. For example, the logical functionality of chip enable circuits 206 and command latch decoder 204 could be implemented in master memory unit 102 as a single logic circuit. It will be appreciated by those ordinarily skilled in the art that various implementations may also be used without departing from the scope of the present invention.

Figure 3:
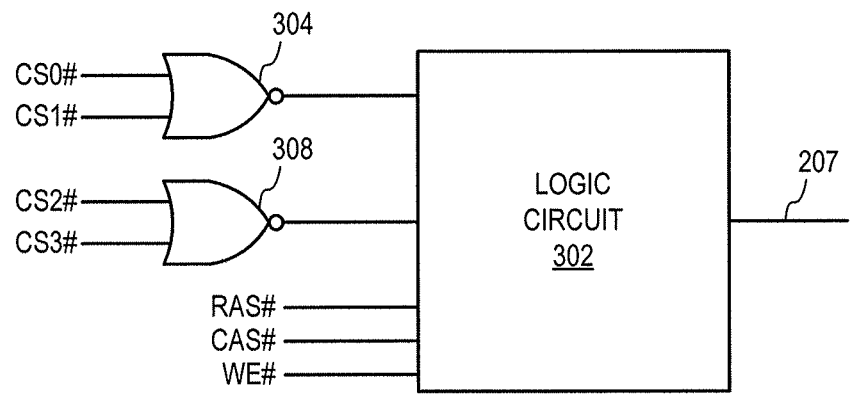
FIG. 3 is a block diagram of a command latch decoder for a memory unit according to an embodiment of the invention.

As noted above, command latch decoder 204 may be configured to receive all of the chip select signals received by memory 100 (FIG. 1). FIG. 3 illustrates the command latch decoder 204 according to an embodiment of the invention having four memory units. Chip select signals CS0# and CS1# may be combined using NOR logic gate 304 and chip select signals CS2# and CS3# may also be combined using NOR logic gate 308. Command latch decoder 204 may include a logic circuit 302 coupled to the NOR gates 304, 308 that is configured to decode command signals RAS#, CAS#, and WE# to generate a decoded command as well as detect a deselect condition when all chip select signals have an inactive state based on the output of the NOR gates. Unless a deselect condition is detected, any decoded command will be output on global command bus 207. In the event that all chip select signals are in an inactive state (i.e., a deselect condition), logic circuit 302 will not provide the output of the command latch decoder 204 to interconnect bus 110 regardless of whether a valid command is decoded or not. It will be appreciated by those in the art that other control logic implementations, such as a command latch decoder absent NOR gates, may also be utilized without departing from the scope of the present invention. It may further be appreciated that other logical states may represent a deselect condition and the embodiment described is in no way limiting.

Figure 4:
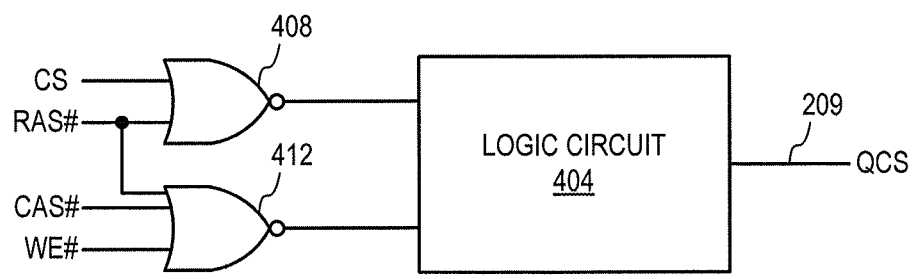
FIG. 4 is a block diagram of a chip enable circuit for a memory unit according to an embodiment of the invention.

FIG. 4 illustrates a chip enable circuit 206 according to an embodiment of the invention. The chip enable circuit 206 receives a corresponding chip select signal and command signals RAS#, CAS#, and WE#. A NOR gate 408 may receive the corresponding chip select signal and the RAS# command signal. A NOR gate 412 may receive the CAS#, RAS# and WE# command signals. The output from both NOR gates 408, 412 may be coupled to logic circuit included in chip enable circuit 206. Logic circuit 404 may determine from the state of the NOR gate outputs if the current command is a NoOp. In that instance, the chip enable circuit 206 does not provide the corresponding chip select signal to latched chip select bus 209. Where the current command is not a NoOp command, the chip select signal may be provided to master interconnect 208 and subsequently provided to interconnect bus 110. It will be appreciated by those in the art that other control logic implementations, such as a chip enable circuit 206 absent NOR gates, may also be utilized without departing from the present invention. It may further be appreciated that other logical states may represent a deselect condition and the embodiment described is in no way limiting.

Figures 5A, 5B, 6:
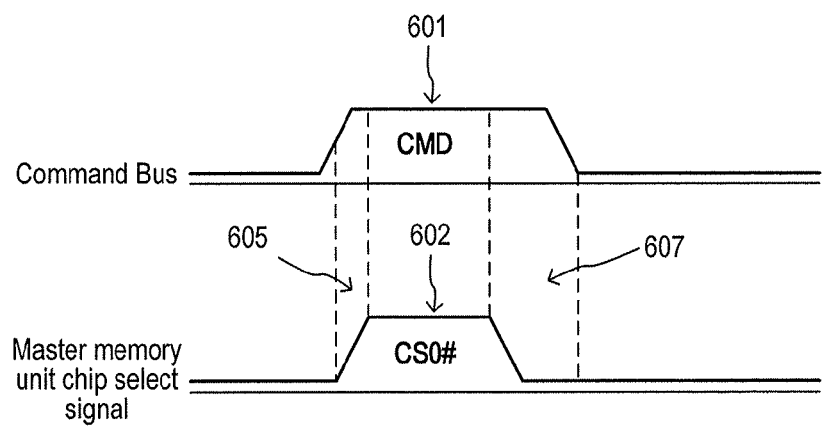
FIGS. 5A and 5B are diagrams of control logic tables according to embodiments of the invention.
FIG. 6 is a timing diagram of various signals during memory operation according to an embodiment of the invention.

FIGS. 5A and 5B further illustrate control logic involved with NoOp and deselect conditions in memory 100. FIG. 5A depicts a control logic table according to an embodiment of the invention. Each chip enable circuit 206 may receive a row address select signal, a column address signal, a write enable signal, and a corresponding chip select signal. In the case where RAS#, CAS# and WE# all have an inactive state, this is decoded to a NoOp command. Such a command may cause chip enable circuit 206 to not provide the chip select signals to interconnect bus 110 (FIG. 2). As a result, the chip select signals are considered as "don't-cares" (illustrated in FIG. 5A as "X") as the chip select signals are not coupled to interconnect bus 110 and no memory unit is enabled to execute a command.

This may provide the benefit of reducing the number of state changes required on interconnect bus 110 thereby reducing power consumption. Additionally, erroneous memory unit operation caused by mismatched timing of the signals on the interconnect bus 110 may be reduced. For example, due to inherent signal propagation delay on the interconnect bus 110, chip select signals may not be synchronized with command signals by the time the chip select signals and command signals are received by the respective memory units on interconnect bus 110. In severe cases of timing skew between, for example, the chip select signals and the command signals, an active chip select signal that is originally associated with a NoOp command may inadvertently enable the corresponding memory unit to read a later valid command propagating on the interconnect bus 110 intended for another memory unit. Thus, errors caused by improperly timed chip select and command signals provided to the memory units on interconnect bus 110 may also be reduced by applying the control logic table of FIG. 5A. That is, rather than having a memory unit inadvertently enabled by an active chip select signal associated with a NoOp command, the receipt of the NoOp command causes the chip enable circuit 206 to prevent coupling any active chip select signal to the interconnect bus 110 to the memory units.

A control logic table according to an embodiment of the invention is shown in FIG. 5B. Because the command latch decoder 204 receives each chip select signal, as noted above, deselect conditions may be detected. In the event that all chip select signals have an inactive state, command signals, such as RAS#, CAS#, and WE# become "don't-cares" (shown in FIG. 5B as "X") as these signals are not provided over interconnect bus 110 by the command latch decoder 204. By not providing the command signals, fewer state changes are required on interconnect bus 110, reducing power consumption. Moreover, because some commands may require multiple clock cycles for execution, in the event that a memory unit improperly registers a command on interconnect bus 110 not intended for any of the memory units (i.e., during the deselect condition), any valid subsequent commands may be ignored if the memory unit is still executing the improperly registered command. For example, an active chip select signal associated with a valid command provided after the deselect condition may inadvertently enable the corresponding memory unit to read the previous command provided during the deselect condition, which may still be propagating on the interconnect bus 110 at the time the active chip select signal would have been provided by the command latch decoder 204. Thus, by not providing commands to the interconnect bus 110, for example, when a deselect condition occurs, errors incurred due to ignored valid commands may be reduced.

As previously described, master memory unit 102 and slave memory units 104a-c may be configured to read command signals from interconnect bus 110 at the time a corresponding chip select signal becomes active. A greater timing margin available for the chip select signals relative to the command signals may provide more robust operation of a memory, for example, memory 100. FIG. 6 shows a timing diagram according to one embodiment of the invention providing greater timing margin for the chip select signal. A chip select signal CS0# corresponding to the master memory unit 102 has a width smaller than a width of a command provided on interconnect bus 110. The chip select signal is also shifted such that the rising edge of command signal 601 is earlier than the rising edge of the chip select signal 602, resulting in delay 605. Additionally, the falling edge of the chip select signal 602 occurs before the falling edge of the command signal

601, resulting in delay 607. Thus, the chip select signal CS0# should not become active when the corresponding decoded command signal is not also active on the interconnect bus 110. This may be accomplished with signal truncation and/or signal shifting, or other methods known in the art. For example, in one embodiment, chip select signals may be truncated using control logic in the chip enable circuits 206 or in master interconnect 208. In another embodiment, chip select signals may be truncated using rising and/or falling edges of a clock signal. In yet another embodiment, chip select signals may be delayed using gate delays. It will be appreciated by those ordinarily skilled in the art that various implementations may also be used without departing from the scope of the present invention.

Figure 7:
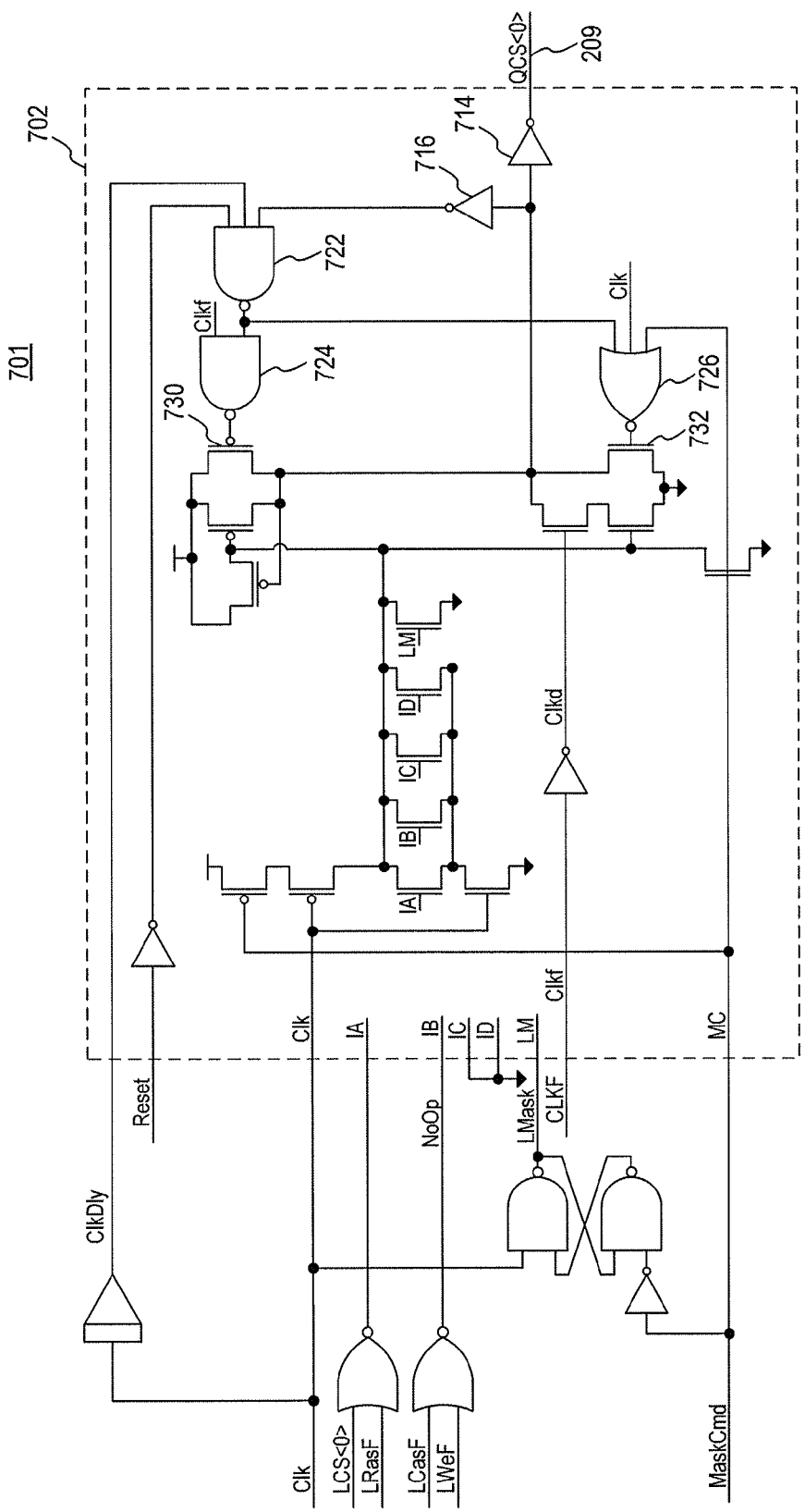
FIG. 7 is a circuit diagram of a chip enable circuit for a memory unit according to an embodiment of the invention.

As noted above, chip select signals may be truncated or delayed to increase available timing margins for the chip select signals relative to the command signals. FIG. 7 illustrates a chip enable circuit 701 having a chip select feedback circuit 702 according to an embodiment of the invention. Chip select feedback circuit 702 may have an output inverter 714 and a feedback inverter 716. A NAND gate 722 may receive a delayed clock signal ClkDly, a reset signal, and the output of feedback inverter 716. A NAND gate 724 may receive an output of the NAND gate 722 in addition to an inverted clock signal, ClkF. the output of the NAND gate 724 may be coupled to the gate of a transistor 730. Additionally, a NOR gate 726 may receive a clock signal CLK and the output of the NAND gate 722. The output of the NOR gate 726 may be coupled to the gate of transistor 732.

In operation, if chip enable circuit 701 has determined that a received command is not a NoOp and that the memory corresponding to chip enable circuit 701 is to be enabled, output inverter 714 and feedback inverter 716 may transition to an active state. The transition of output inverter 714 to an active state may result in the enablement of the chip select signal corresponding to chip enable circuit 701 on latched chip select bus 209. When inverted clock signal ClkF is in an active state, a feedback path, consisting of feedback inverter 716, NAND gate 722, NOR gate 726, and transistor 732, may be enabled and cause the output of output inverter 714 to remain in an active state until the delayed clock signal ClkDly also transitions to an inactive state. When this occurs, the feedback path may be disabled and cause the output of NAND gate 722 to deactivate the output of NOR gate 726, in turn causing transistor 732 to turn off. Delayed clock signal ClkDly transitioning to an inactive may also cause NAND gate 724 to activate transistor 730, thereby causing the output of output inverter 714 to transition to an inactive state.

As a result of inputting delayed clock signal ClkDly into NAND gate 722, the period of time in which the output of output inverter 714 is in an active state may be truncated. The amount of truncation may be any length up to a full clock cycle. For example, in at least one embodiment, truncation may be approximately half the clock period. In another embodiment, truncation may be a quarter clock cycle. It will be appreciated by those in the art that other control logic implementations may also be utilized without departing from the scope of the present invention.

Figure 8:
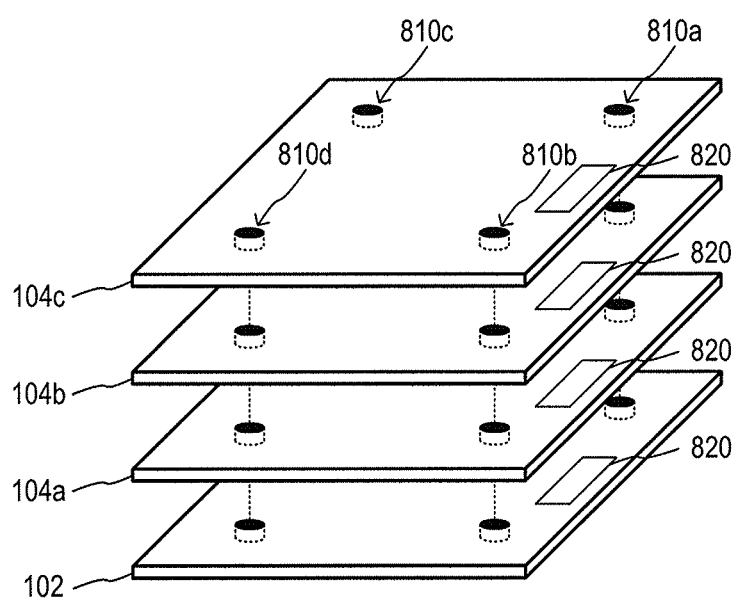
FIG. 8 is a front perspective view of a memory according to an embodiment of the invention.

FIG. 8 illustrates a front perspective view of a memory 100. As described above, slave memory units 104*a-c* may be stacked on master memory unit 102. In at least one embodiment, master memory unit 102 may be located at the bottom position of the memory unit stack. In other embodiments, master memory unit may be on top of the stack or placed between slave memory units 104*a-c*. Moreover, interconnects 810*a-d* may allow master memory unit 102 and slave memory units 104*a-c* to exchange data and commands on common busses. For example, as shown in FIG. 8, four interconnects may be used. It will be appreciated by those having skill in the art, however, that any greater or lesser number of interconnects may be used.

Additionally, master memory unit 102 and slave memory units 104*a-c* may be substantially similar. In one embodiment, interconnects 810*a-d* may extend through master memory unit 102 and slave memory units 104*a-c* at the same relative locations of each memory unit. Additionally, in another embodiment, control logic 820 in master memory unit 102 may be reproduced in each slave memory unit 104*a-c* such that any of the memory units may operate as the master memory unit of a stack if configured to do so.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory, comprising:
   an input to receive command signals and chip select signals;
   a chip enable circuit coupled to the input and configured to receive the command signals and at least one of the chip select signals, the chip enable circuit configured to provide a memory unit enable signal responsive, at least in part, to the command signals having a first combination of states and the at least one of the chip select signals being active and further configured to not provide the memory unit enable signal responsive to the command signals having a second combination of states and the at least one of the chip select signals being active; and
   a command decoder coupled to the input and configured to receive the command signals and the chip select signals, the command decoder further configured to provide a memory unit command signal responsive to the command signals having the second combination of states,
   wherein the memory unit enable signal is provided for a first period and the memory unit command signal is provided for a second period, the second period having greater duration than the first period.

2. The memory of claim .1, further comprising:
   a master interconnect coupled to the plurality of chip enable circuits and configured to receive chip select signals and provide the chip select signals to an interconnect bus.

3. The memory of claim 2, further comprising:
   a slave memory unit coupled to the interconnect bus and configured to be enabled responsive to receipt of a corresponding chip select signal.

4. The memory of claim 1, wherein the command decoder is further configured to not provide the memory unit command signal responsive to the plurality of chip select signals having the first combination of states.

5. A memory, comprising:
   an interconnect bus;
   at least one master memory unit coupled to the interconnect bus and configured to receive a plurality of command signals representing a command and a plurality of chip select signals, the at least one master memory unit configured to provide the command and a chip enable signal to the interconnect bus responsive to receipt of the plurality of command signals and at least one of the a plurality of chip select signals being active and to not provide the command to the interconnect bus responsive to the plurality of chip select signals being inactive; and a slave memory unit coupled to the interconnect bus, the slave memory unit configured to be enabled and receive the command from the interconnect bus responsive to receipt of the chip enable signal.

6. The memory of claim 5, the at least one master memory die further configured to:
couple the command to the interconnect bus for a first period; and
couple the chip enable signal to the interconnect bus for a second period, wherein the first period begins before the second period begins and the second period ends before the first period ends.

7. The memory of claim 5 wherein the master memory unit is further configured to not provide the chip enable signal to the interconnect bus responsive to receipt of the plurality of command signals representing a NoOp command.

8. The memory of claim 5, wherein the master memory unit and the slave memory unit are arranged in a stack.

9. The memory of claim 8, wherein the master memory unit is located at the bottom position of the stack.

10. The memory of claim 5, wherein the master memory unit and the slave memory unit comprise substantially similar control logic.

11. A method for executing memory commands, comprising;
receiving at a master memory unit a plurality of command signals and a plurality of chip select signals, each of the plurality of chip select signals having an active state or an inactive state;
decoding the plurality of command signals at a master memory unit;
outputting a command to an interconnect bus responsive, at least in part, to receipt of at least one active chip select signal, the command having a first width; and
outputting at least one chip enable signal to the interconnect bus responsive to decoding a valid command, the at least one chip enable signal having a second width less than the first width.

12. The method of claim 11, wherein outputting a command comprises:
determining if at least one of the plurality of chip select signals is active; and
outputting a command based, at least in part, on the plurality of command signals.

13. The method of claim 11, further comprising:
not providing an output responsive to the chip select signals having inactive states or the plurality of command signals having an invalid state.

14. The method of claim 11, further comprising:
coupling the command from the interconnect bus to a slave memory unit; and
coupling the at least one chip enable signal to the slave memory unit.

15. The method of claim 14, further comprising:
executing the command with the slave memory unit.

16. A method for executing memory commands, comprising:
receiving an active chip select signal at a master memory unit;
generating a memory command responsive to receipt of an active chip select signal;
outputting the memory command to an interconnect bus;
executing the command at a slave memory unit;
receiving an inactive chip select signal at a master memory unit; and
not providing a memory command to the interconnect bus responsive to receipt of the inactive chip select signal.

17. The method of claim 16, wherein the active chip select signal has a first width and the memory command has a second width, the first width smaller than the second width.

18. The method of claim 16, further comprising:
before generating a memory command, receiving, a plurality of memory command signals.

19. The method of claim 18, further comprising:
masking an output from the interconnect bus responsive to the plurality of memory command signals having an invalid state.

20. The method of claim 16, wherein generating a memory command comprises:
receiving the active chip select signal;
receiving a plurality of command signals; and
decoding the command signals to generate a command.

21. The method of claim 16, further comprising
outputting read data to the interconnect bus; and
coupling the read data to an external device.

22. A memory comprising:
a memory unit of a first type configured to receive chip select signals, the memory unit of a first type farther configured to output a command and at least one enable signal responsive, at least in part, to at least one chip select signal being active, wherein the memory unit of a fist type is further configured to truncate the at least one enable signal; and
a plurality of memory units of a second type coupled to the memory unit of a first type and configured to receive the command and the at least one enable signal, a memory unit of a second type of the plurality of memory units of a second type further configured to execute the command responsive to the at least one enable signal corresponding to the memory unit of a second type of the plurality of memory units of a second type;
wherein the memory unit of a first type and the plurality of memory units of a second type are arranged in a stack.

23. The memory of claim 22, wherein the memory unit of a first type further comprises:
a decoder configured to receive command signals and generate the command responsive to the command signals comprising a valid command.

24. The memory of claim 22, wherein the memory unit of a first type and the plurality of memory units of a second type are coupled with interconnects.

* * * * *

UNITED STATES PATENT AND TRADEMARK OFFICE
CERTIFICATE OF CORRECTION

| | | |
|---|---|---|
| PATENT NO. | : 8,913,447 B2 | Page 1 of 1 |
| APPLICATION NO. | : 13/168723 | |
| DATED | : December 16, 2014 | |
| INVENTOR(S) | : Jacob Robert Anderson et al. | |

It is certified that error appears in the above-identified patent and that said Letters Patent is hereby corrected as shown below:

In the Claims

In column 8, line 42, in Claim 1, before "greater" insert -- a --.

In column 8, line 43, in Claim 2, delete "claim .1," and insert -- claim 1, --, therefor.

In column 8, line 64, in Claim 5, delete "the a" and insert -- a --, therefor.

In column 9, line 24-25, in Claim 11, delete "comprising;" and insert -- comprising: --, therefor.

In column 10, line 16, in Claim 18, delete "receiving," and insert -- receiving --, therefor.

In column 10, line 27, in Claim 21, delete "comprising" and insert -- comprising: --, therefor.

In column 10, line 33, in Claim 22, delete "farther" and insert -- further --, therefor.

In column 10, line 37, in Claim 22, delete "fist" and insert -- first --, therefor.

Signed and Sealed this
Seventeenth Day of March, 2015

Michelle K. Lee
*Director of the United States Patent and Trademark Office*